(12) United States Patent
Keshishian

(10) Patent No.: US 8,299,857 B2
(45) Date of Patent: Oct. 30, 2012

(54) RF POWER AMPLIFIER INCLUDING BROADBAND INPUT MATCHING NETWORK

(75) Inventor: Richard P. Keshishian, El Segundo, CA (US)

(73) Assignee: Integra Technologies, Inc., El Segundo, CA (US)

( * ) Notice: Subject to any disclaimer, the term of this patent is extended or adjusted under 35 U.S.C. 154(b) by 0 days.

(21) Appl. No.: 13/015,368

(22) Filed: Jan. 27, 2011

(65) Prior Publication Data
US 2012/0194272 A1  Aug. 2, 2012

(51) Int. Cl.
 *H03F 3/191* (2006.01)
(52) U.S. Cl. .................................. 330/302; 330/307
(58) Field of Classification Search ................. 330/302, 330/306, 307
See application file for complete search history.

(56) References Cited

U.S. PATENT DOCUMENTS

| | | | | |
|---|---|---|---|---|
| 6,437,649 B2 * | 8/2002 | Miyashita et al. | | 330/302 |
| 6,489,843 B1 * | 12/2002 | Nishijima et al. | | 330/51 |
| 7,123,096 B2 * | 10/2006 | Selin | | 330/295 |
| 7,554,410 B2 * | 6/2009 | Kawashima et al. | | 330/302 |

\* cited by examiner

*Primary Examiner* — Steven J Mottola
(74) *Attorney, Agent, or Firm* — Fountain Law Group, Inc.; George L. Fountain; Vy H. Vu

(57) ABSTRACT

An RF power amplifier is disclosed that has improved input matching or reduced return losses over a wider frequency range. The amplifier includes an input impedance matching network, a resistive element, a transistor, and an output impedance matching network. The resistive element is coupled between the input impedance matching network and the input of the transistor. The resistive element is configured to lower the quality factor (Q) of the input impedance matching network. This has the effect of reducing the input impedance variation over a given frequency range. As a result, the overall impedance matching over the given frequency range is improved, thereby reducing the input return losses. This allows the RF power amplifier to be used in wider bandwidth applications.

26 Claims, 3 Drawing Sheets

RF POWER AMPLIFIER INCLUDING BROADBAND INPUT MATCHING NETWORK

FIELD

This invention relates generally to radio frequency (RF) devices, and in particular, to an RF power amplifier including a broadband input matching network.

BACKGROUND

High power RF amplifiers are employed in many applications. For example, these amplifiers are used in radar, communication, avionics, electronic counter measures (ECM), medical, and other applications. These amplifiers are generally implemented as hybrid devices, and include one or more discrete transistors, one or more discrete capacitors, and one or more discrete inductors that are housed in a package. The one or more capacitors are typically realized using silicon metal oxide semiconductor (MOS), silicon metal insulator metal (MIM), or ceramic MIM components. The one or more inductors are typically realized using wirebonds.

The transistors used in high power RF amplifiers are typically comprised of a plurality of transistor cells coupled in parallel. The cells are configured to respectively receive and amplify portions of an input RF signal, wherein the individual amplified signals are combined at the transistor output to generate an output RF signal. Because there may be many transistor cells coupled in parallel, a typical RF power transistor has a low input impedance (e.g., 0.075 Ohm for each side of a 130 Watt device), as well as a low output impedance.

Typically, the characteristic impedance of transmission lines for providing RF signals to and from high power RF transistor is usually in the range of 50 to 100 Ohms. Accordingly, RF power devices typically incorporate one or more input matching networks coupled to the input of the transistor, and one or more output impedance matching networks coupled to the output of the transistor. This is done to increase the inherently low transistor die impedances and facilitate matching the amplifier to the 50 to 100 Ohm system impedance used by external components.

A typical input (as well as output) impedance matching circuit is comprised of inductive and capacitive elements. Accordingly, its impedance matching performance is a function of frequency. In the past, acceptable broadband performance using such impedance matching networks was typically difficult to achieve. For example, in a prior 130 Watt amplifier, it was difficult to achieve a desirable input return loss across a band of 2.7-3.5 GHz using the standard input matching networks. Thus, one design was configured for acceptable input return loss in the range of 2.7-3.1 GHz, and another design was configured for acceptable input return loss in the range of 3.1-3.5 GHz. However, having two distinct designs generally complicates parts inventory, manufacturing and other processes.

Accordingly, there is a need for an input impedance matching network that provides desirable input return loss across a wider bandwidth.

SUMMARY

An aspect of the disclosure relates to an RF power amplifier that has improved input matching or reduced return losses over a wider frequency range. In particular, the RF power amplifier comprises an input transmission line, an input impedance matching network, a resistive element, a transistor, an output impedance matching network, and an output transmission line. The input impedance matching network is adapted to improve the impedance matching between the input transmission line and the input of the transistor over a given frequency range. Similarly, the output impedance matching network is adapted to improve the impedance matching between the output of the transistor and the output transmission line over the given frequency range.

The resistive element is coupled between the input impedance matching network and the input of the transistor. The resistive element is configured to lower the quality factor (Q) of the input impedance matching network for a given input impedance value. This has the effect of reducing the input impedance variation over the given frequency range. As a result, the overall input impedance matching over the given frequency range is improved, thereby reducing the input return losses. This allows the RF power amplifier to be used in wider bandwidth applications.

Other aspects, advantages and novel features of the present disclosure will become apparent from the following detailed description when considered in conjunction with the accompanying drawings.

DETAILED DESCRIPTION OF THE EXEMPLARY EMBODIMENTS

Figure 1:
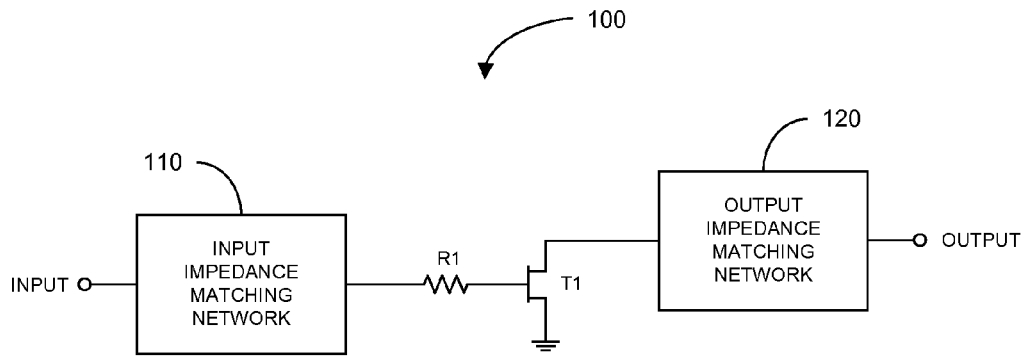
FIG. 1 illustrates a block/schematic diagram of an exemplary RF power amplifier in accordance with an aspect of the disclosure.

FIG. 1 illustrates a block/schematic diagram of an exemplary RF power amplifier 100 in accordance with an aspect of the disclosure. In summary, the RF amplifier 100 includes a resistive element (e.g., a chip or thin-film resistor) situated between an input impedance matching network and a transistor. The resistive element is adapted to lower the quality factor (Q) of the input impedance matching network. This has the effect of reducing the impedance variation across a particular frequency bandwidth, which results in an overall improvement in the return loss at those frequencies. This allows the RF amplifier to be used in wider bandwidth applications.

More specifically, the RF power amplifier 100 comprises an input impedance matching network 110, a resistive element R1 (e.g., a resistor), a transistor T1 (e.g., a field effect transistor (FET)), and an output impedance matching network 120. The input impedance matching network 110 is adapted to receive an input RF signal, and provide the input RF signal to an input terminal (e.g., gate) of the transistor T1 by way of the resistive element R1. The transistor T1 is adapted to amplify the input RF signal to generate an amplified RF signal at an output terminal (e.g., drain) thereof. A third terminal (e.g., source) of the transistor T1 may be coupled to ground potential. The output impedance matching network receives the amplified RF signal to generate the output RF signal for the RF power amplifier 100.

As previously discussed, the transistor T1 may be configured as a power transistor. The power transistor T1 may be based on many distinct technologies, such as field effect transistor (FET) and bipolar technologies. For example, the power transistor T1 may be configured as a laterally diffused metal oxide semiconductor (LDMOS) FET, a vertically diffused metal oxide semiconductor (VDMOS) FET, or a gallium nitride (GAN) FET. Generally, such power transistor T1 typically include a plurality of cells coupled in parallel. Thus, the transistor T1 has a relatively low input impedance (e.g., 0.075 Ohm for each side of a 130 Watt device), as well as a relatively low output impedance.

Typically, an input transmission line for routing an input RF signal to the RF power amplifier 100 has a characteristic impedance in the range of 50 to 100 Ohms, whereby 50 Ohms is most common. Because of the impedance disparity between the input transmission line and the input of the transistor T1, the input impedance matching network 110 provides a smoother the transition between the impedances of the input transmission line and the input of the transistor T1. This is done so as to reduce reflection of the input RF signal at the transistor input, and the resulting signal loss (e.g., return loss) due to those reflections.

The input impedance matching network 110 is generally realized with inductive and capacitive elements. These may be discrete elements, such as wirebonds for inductive elements and chip capacitors (e.g., silicon metal oxide semiconductor (MOS), silicon metal insulator metal (MIM), or ceramic MIM components) for capacitive elements. It shall be understood that such inductive and capacitive elements need not be discrete elements, and may be printed on ceramic or semiconductor substrates, such as pattern traces for the case of the inductive elements and dielectric thin films in the case of the capacitive elements. Because the input impedance matching network 110 depends on inductive and capacitive elements, its impedance matching capability is frequency dependent. Thus, in some cases, the input impedance matching network 110 by itself may not provide the desired impedance matching across a particular bandwidth.

To improve the impedance matching across a wider frequency bandwidth, the resistive element R1 is coupled between the input impedance matching network 110 and the input of the transistor T1. The resistive element R1 is configured to lower the Q of the input impedance matching network 110. This has the effect of reducing the impedance variation across a particular frequency bandwidth, which results in an overall improvement in the return loss at those frequencies. Thus, the RF amplifier 100 may be configured to provide desirable return loss for wider bandwidth. The resistive element R1 may be implemented as discrete devices, such as one or more chip resistors, or may be implemented as one or more thin-film resistors disposed on a ceramic or semiconductor substrate. For example, the resistive element R1 may be integrated into the same die on which the transistor T1 is formed.

The resistance of the resistive element R1 may be based on the equivalent series resistance RG of the input of the transistor T1. For example, the ratio of the resistive element R1 and the equivalent resistance RG of the transistor input (i.e., R1/RG) may be set to be within a range of 0.25 to 2. At the lower part of the range (e.g., R1/RG=0.25), the improvement in the input impedance matching may be relatively small, but the degradation in the gain of the amplifier may likewise be relatively small. On the other hand, at the upper part of the range (e.g., R1/RG=2), the improvement in the input impedance matching may be relatively large, but the degradation in the gain of the amplifier may likewise be relatively large. Thus, there is a tradeoff between improved impedance matching over a wider bandwidth and the overall gain of the amplifier.

Finally, the output impedance matching network 120 is configured to smoothly transition the disparate impedances of the output or drain of the transistor T1 and the output transmission line of the RF power amplifier 100. Similar to the input impedance matching network 110, the output impedance matching network 120 may be implemented using discrete inductive elements (e.g., wirebonds) and discrete capacitive elements (e.g., silicon metal oxide semiconductor (MOS), silicon metal insulator metal (MIM), or ceramic MIM components). It shall be understood that such inductive and capacitive elements may also be implemented on ceramic or semiconductor substrates, such as pattern traces for the case of the inductive elements and dielectric thin films in the case of the capacitive elements.

Figure 2:
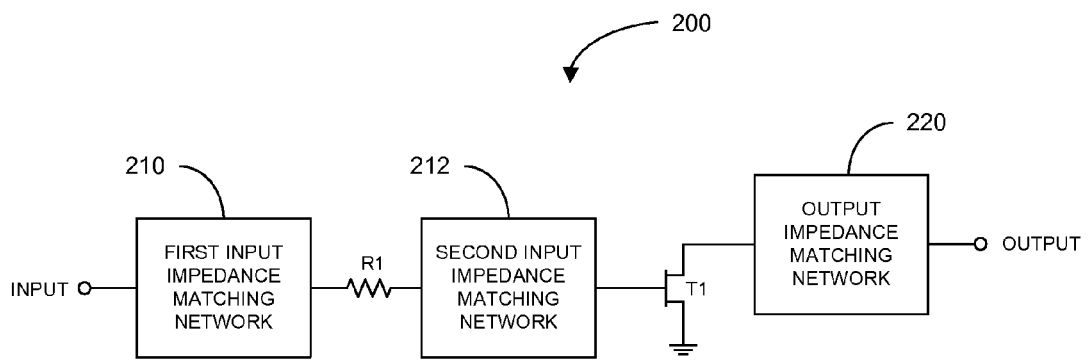
FIG. 2 illustrates a block/schematic diagram of another exemplary RF power amplifier in accordance with another aspect of the disclosure.

FIG. 2 illustrates a block/schematic diagram of another exemplary RF power amplifier 200 in accordance with another aspect of the disclosure. In summary, the RF power amplifier 200 includes a plurality of cascaded input impedance matching networks or stages, and a Q-lowering resistive element situated between cascaded impedance matching networks. Similar to the previously-discussed RF power amplifier 100, the Q-lowering resistive element improves the input return loss of the RF power amplifier 200 across a wider bandwidth.

More specifically, the RF power amplifier 200 comprises a first input impedance matching network 210, a resistive element R1, a second input impedance matching network 212, a transistor T1, and an output impedance matching network 220. The first and second input impedance matching networks 210 and 212 along with the resistive element R1 route an input RF signal to the input (e.g., gate) of transistor T1 in a manner so as to prevent an undesired amount of return losses. The two-stage impedance matching networks 210 and 212 along with the Q-lowering resistive element R1 improves the input return losses across a wider bandwidth. The transistor T1 amplifies the input RF signal and the output impedance matching network 220 provides the amplified RF signal to an output transmission line of the RF power amplifier 200, while reducing return losses at the output of the amplifier 200.

Figure 3:
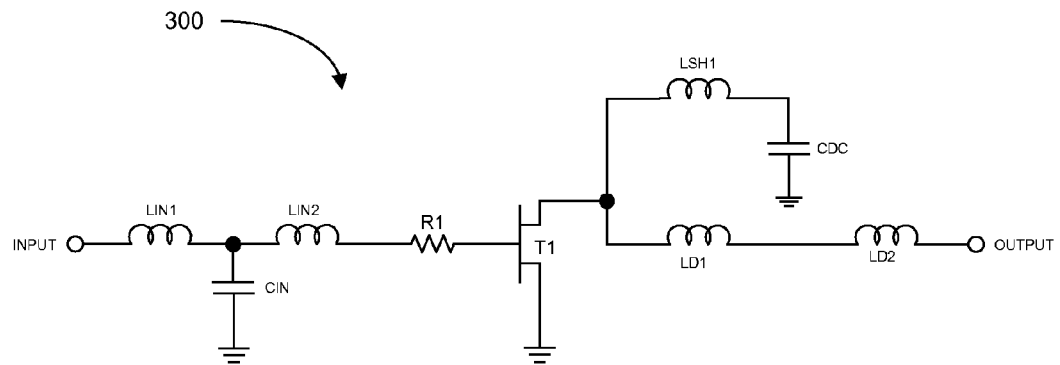
FIG. 3 illustrates a schematic diagram of yet another exemplary RF power amplifier in accordance with another aspect of the disclosure.

FIG. 3 illustrates a schematic diagram of yet another exemplary RF power amplifier 300 in accordance with another aspect of the disclosure. The RF power amplifier 300 is an example of a more detailed implementation of the RF power amplifier 100 previously discussed. The RF power amplifier 300 comprises an input impedance matching network including input series inductors LIN1 and LIN2 and input shunt capacitor CIN, a Q-lowering resistive element R1, a transistor T1, and an output impedance matching network including output series inductors LD1 and LD2, output shunt inductor LSH1, and output shunt capacitor CDC. As previously discussed, the inductors, capacitors and resistor R1 may be implemented as discrete devices, integrated into a ceramic and semiconductor substrate as printed traces and thin films, or any combination thereof. Additionally, the resistor R1 may be formed on the semiconductor die on which the transistor T1 is formed.

Figure 4:
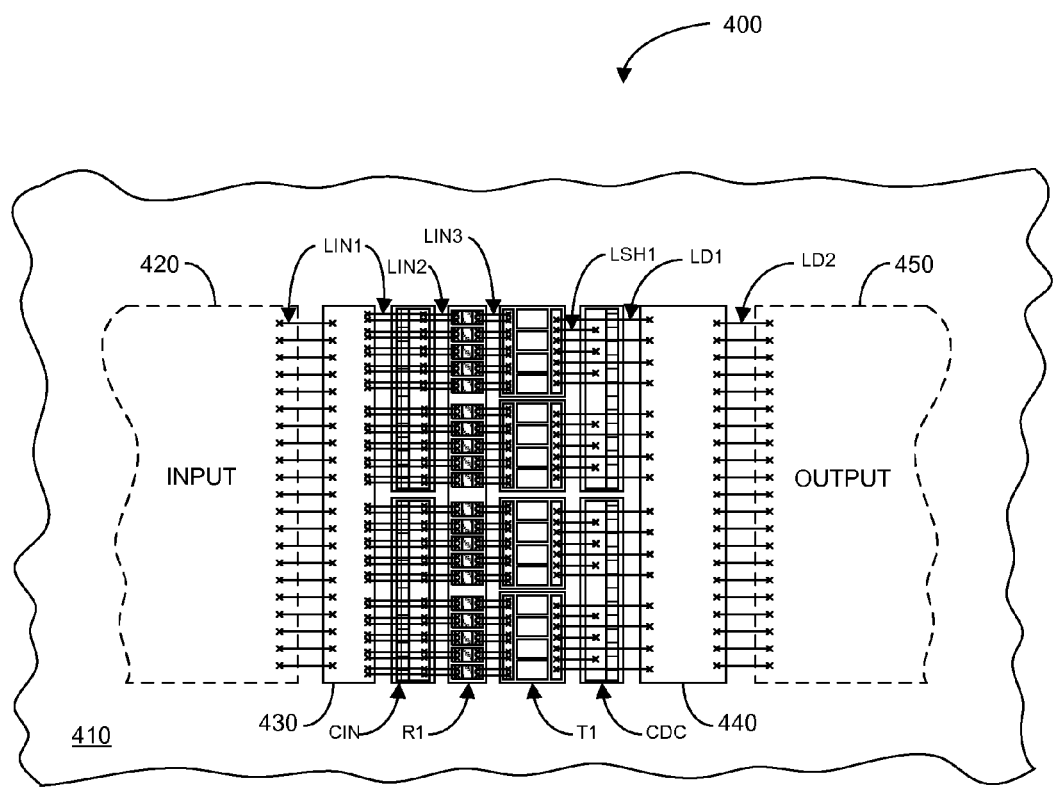
FIG. 4 illustrates a top view of still another exemplary RF power amplifier in accordance with another aspect of the disclosure.

FIG. 4 illustrates a top view of still another exemplary RF power amplifier 400 in accordance with another aspect of the disclosure. The RF power amplifier 400 is an example of a hybrid implementation of a RF power amplifier previously discussed.

In particular, the RF power amplifier 400 comprises a ceramic or metal substrate 410 (e.g., alumina, copper tungsten, or others) on which the components of the amplifier are formed or disposed. The RF power amplifier 400 further comprises an input transmission line 420, an input bridge 430, an input capacitor CIN, a plurality of Q-lowering chip resistors R1, an RF power transistor T1, an output capacitor CDC, an output bridge 440, and an output transmission line 450, all of which are disposed on the substrate 410.

On the input side, the RF power amplifier 400 further comprises first and second sets of parallel wirebonds respectively coupling the input transmission line 420 to the input bridge 430, and the input bridge 430 to the input capacitor CIN. The first and second sets of wirebonds forms the first inductive element LIN1 of the input impedance matching network. The input capacitor CIN forms the shunt capacitive element of the input impedance matching network, with one of its terminals being coupled to ground potential. The power amplifier 400 also comprises a third set of parallel wirebonds coupling the input capacitor CIN to the Q-lowering chip resistors R1. The third set of wirebonds forms the second inductive element LIN2 of the input impedance matching network. Additionally, the RF power amplifier 400 comprises a fourth set of parallel wirebonds coupling the Q-lowering chip resistors R1 to the input terminal (e.g., gate) of the transistor T1.

On the output side, the RF power amplifier 400 comprises a fifth set of parallel wirebonds coupling the output terminal (e.g., drain) of the transistor T1 to the output bridge 440. The fifth set of wirebonds forms the first series inductor LD1 of the output impedance matching network. The RF power amplifier 400 further comprises a sixth set of parallel wirebonds coupling the output terminal of the transistor T1 to the output shunt capacitor CDC. The sixth set of parallel wirebonds forms the shunt inductance LSH1 of the output impedance matching network. The output capacitor CDC forms the shunt capacitive element of the output impedance matching network, with one of its terminals being coupled to ground potential. Finally, the RF power amplifier 400 comprises a seventh set of parallel wirebonds coupling the output bridge 440 to the output transmission line 450. The seventh set of parallel wirebonds forms the second series inductance element LD2 of the output impedance matching network.

As with the previous RF power amplifiers, the resistors R1 lowers the Q of the input impedance matching network to improve the return loss across a wider bandwidth. The resistors R1 may be implemented as many parallel individual chip resistors as shown, and substantially placed uniformly across the width of the transistor T1 via individual bondwire attachment to each discrete resistor element. This is done to balance the resistance uniformly across the transistor chip and the input impedance matching network. Alternatively, as previously suggested, the resistor R1 may be formed on the same die as that of the transistor T1. In this regard, the resistor R1 may be configured as thin film and also substantially situated uniformly across the width of the transistor T1. Although not shown, the underside of the transistor T1 includes a third terminal (e.g., source) which may be coupled to ground metallization layer disposed on the underside of the ceramic substrate 410 via one or more metalized via holes. The input and output capacitors CIN and CDC may be grounded in a similar manner. If the substrate 410 is metallic, via holes are not required, and grounding may be effectuated by direct attachment to the metal substrate 410.

Figure 5:
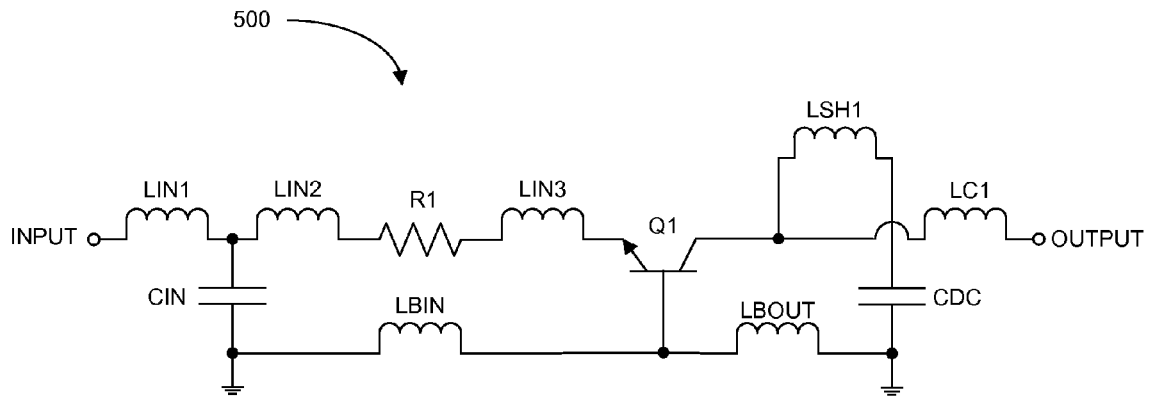
FIG. 5 illustrates a schematic diagram of yet another exemplary RF power amplifier in accordance with another aspect of the disclosure.

FIG. 5 illustrates a schematic diagram of yet another exemplary RF power amplifier 500 in accordance with another aspect of the disclosure. In the previous embodiments, the RF power amplifier has been described primarily with a FET type transistor as the active power device for the amplifier. In this embodiment 500, the active power device is a bipolar transistor. Because of this, the input and output impedance matching networks may be configured differently. However, the RF power amplifier 500 still includes a resistive element adapted to lower the Q of the input impedance matching network so as to improve the input return loss over a wider frequency bandwidth.

More specifically, the RF power amplifier 500 comprises an input impedance matching network including series inductive elements LIN1 and LIN2, input base inductive element LBIN, and input shunt capacitive element CIN. Additionally, the RF power amplifier 500 comprises a resistive element R1 coupled between the input impedance matching network and the input terminal (e.g., emitter) of a bipolar transistor Q1 by way of another inductive element LIN3. The RF power amplifier 500 further comprises an output impedance matching network including shunt inductive element LSH1, series inductive element LC1, output base inductive element LBOUT, and output shunt capacitive element CDC.

Figure 6:
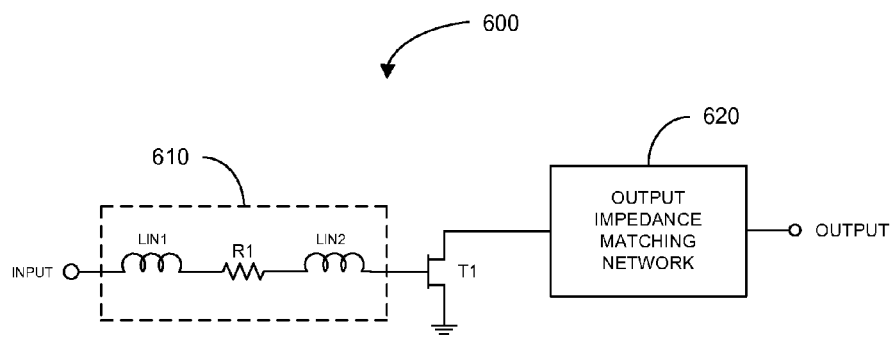
FIG. 6 illustrates a schematic diagram of a further exemplary RF power amplifier in accordance with another aspect of the disclosure.

FIG. 6 illustrates a schematic diagram of a further exemplary RF power amplifier 600 in accordance with another aspect of the disclosure. The RF power amplifier 600 comprises an input impedance matching network 610, a transistor T1 (e.g., a FET), and an output impedance matching network 620. The input impedance matching network 610 is coupled between the input of the RF power amplifier 600 and the input (e.g., gate) of the transistor T1. Similarly, the output impedance matching network 620 is coupled between the output (e.g., drain) of the transistor T1 and the output of the RF power amplifier 600.

In this embodiment, the input impedance matching network comprises a first input inductive element LIN1, a resistive element R1, and a second input inductive element LIN2, all of which are coupled in series between the input of the RF power amplifier 600 and the input of the transistor T1. The first and second inductive elements LIN1 and LIN2 may each be realized as a plurality of wirebonds coupled in parallel, metalized traces formed on a substrate, or a combination of both. The resistive element R1 may be realized as a plurality of chip resistors substantially placed uniformly across the width of the transistor T1, with the parallel wirebonds (LIN1 and LIN2) electrically connecting the resistors to the input of the power amplifier 600 and the input of the transistor T1, respectively. Alternatively, or in addition to, the resistive element R1 may be realized as one or more thin-film resistors formed on a substrate of the semiconductor die on which the transistor T1 is formed. As with the previous embodiments, the resistive element R1 reduces the variation in the input impedance for a given frequency range.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An RF power amplifier, comprising:
   an input transmission line adapted to receive an input RF signal;
   a transistor adapted to amplify the input RF signal to generate an output RF signal;
   a first input impedance matching network coupled between the input transmission line and an input of the transistor, wherein the first impedance matching network is adapted to improve an input impedance matching between the input transmission line and the input of the transistor for a defined frequency range;

a resistive element coupled between the first input impedance matching network and the input of the transistor, wherein the resistive element is adapted to lower a quality factor (Q) of the first input impedance matching network to improve the impedance matching for the defined frequency range;

an output transmission line adapted to produce the output RF signal;

an output impedance matching network coupled between an output of the transistor and the output transmission line, wherein the output impedance matching network is adapted to improve an output impedance matching between the output of the transistor and the output transmission line for the defined frequency range; and a second input impedance matching network coupled between the resistive element and the input of the transistor, wherein the second impedance matching network is adapted to improve an input impedance matching between the input transmission line and the input of the transistor for the defined frequency range.

2. The RF power amplifier of claim 1, wherein the resistive element comprises a chip resistor.

3. The RF power amplifier of claim 1, wherein the resistive element comprises a thin-film resistor.

4. The RF power amplifier of claim 3, wherein the thin-film resistor is formed on a semiconductor die on which the transistor is formed.

5. The RF power amplifier of claim 1, wherein a resistance of the resistive element is based on an equivalent resistance of the input of the transistor.

6. The RF power amplifier of claim 5, wherein a ratio of the resistance of the resistive element and the equivalent resistance of the input of the transistor is approximately 0.25 to 2.

7. The RF power amplifier of claim 1, wherein the transistor comprises a field effect transistor (FET), and the input and output of the transistor comprises a gate and a drain of the FET, respectively.

8. The RF power amplifier of claim 7, wherein the FET comprises a laterally diffused metal oxide semiconductor (LDMOS) FET.

9. The RF power amplifier of claim 7, wherein the FET comprises a vertically diffused metal oxide semiconductor (VDMOS) FET.

10. The RF power amplifier of claim 1, wherein the transistor comprises a bipolar transistor, and the input and output of the transistor comprises an emitter and a collector of the bipolar transistor, respectively.

11. The RF power amplifier of claim 1, wherein the first input impedance matching network comprises:
   a first inductive element;
   a second inductive element coupled in series with the first inductive element, the input transmission line, and the resistive element; and
   a capacitive element coupled to a node between the first and second inductive elements and ground potential.

12. The RF power amplifier of claim 11, wherein the first and second inductive elements comprise first and second sets of wirebonds coupled in parallel, respectively.

13. The RF power amplifier of claim 11, wherein the capacitive element comprises a silicon metal oxide semiconductor (MOS), silicon metal insulator metal (MIM), or ceramic MIM.

14. The RF power amplifier of claim 1, wherein the output impedance matching network comprises:
   a first series inductive element coupled to the output of the transistor;
   a second series inductive element coupled in series with the first inductive element and the output transmission line;
   a third inductive element; and
   a capacitive element coupled in series with the third inductive element between the output of the transistor and ground potential.

15. An RF power amplifier, comprising:
   an input transmission line;
   a transistor including an input and an output;
   a first input impedance matching network adapted to improve an input impedance match between the input transmission line and the input of the transistor for a defined frequency range;
   a resistive element adapted to improve the input impedance match for the defined frequency range;
   an output transmission line;
   an output impedance matching network adapted to improve an output impedance match between the output of the transistor and the output transmission line for the defined frequency range; and
   a second input impedance matching network coupled between the resistive element and the input of the transistor, wherein the second impedance matching network is adapted to improve the input impedance match between the input transmission line and the input of the transistor for the defined frequency range.

16. The RF power amplifier of claim 15, wherein a resistance of the resistive element is based on an equivalent resistance of the input of the transistor.

17. The RF power amplifier of claim 16, wherein a ratio of the resistance of the resistive element and the equivalent resistance of the input of the transistor is approximately 0.25 to 2.

18. The RF power amplifier of claim 15, wherein the transistor comprises a field effect transistor (FET).

19. The RF power amplifier of claim 15, wherein the transistor comprises a bipolar transistor.

20. An RF power amplifier, comprising:
   an input transmission line;
   a transistor including an input and an output;
   an input impedance matching network including a resistive element adapted to improve an input impedance match between the input transmission line and the input of the transistor for a defined frequency range;
   an output transmission line; and
   an output impedance matching network adapted to improve an output impedance match between the output of the transistor and the output transmission line for the defined frequency range;
   wherein the input impedance network further comprises a first inductive element and a second inductive element, both of which are coupled in series between the input transmission line and the input of the transistor;
   wherein the resistive element comprises a plurality of chip resistors;
   wherein the first inductive element comprises a plurality of wirebonds coupled in parallel between the input transmission line and the chip resistors, respectively; and
   wherein the second inductive element comprises a plurality of wirebonds coupled in parallel between the chip resistors and the input of the transistor, respectively.

21. An RF power amplifier, comprising:
an input transmission line adapted to receive an input RF signal;
a transistor adapted to amplify the input RF signal to generate an output RF signal;
a first input impedance matching network coupled between the input transmission line and an input of the transistor, wherein the first impedance matching network is adapted to improve an input impedance matching between the input transmission line and the input of the transistor for a defined frequency range;
a resistive element coupled between the first input impedance matching network and the input of the transistor, wherein the resistive element is adapted to lower a quality factor (Q) of the first input impedance matching network to improve the impedance matching for the defined frequency range;
an output transmission line adapted to produce the output RF signal; and
an output impedance matching network coupled between an output of the transistor and the output transmission line, wherein the output impedance matching network is adapted to improve an output impedance matching between the output of the transistor and the output transmission line for the defined frequency range;
wherein the input impedance matching network further comprises:
a first inductive element;
a second inductive element coupled in series with the first inductive element, the input transmission line, and the resistive element; and
a capacitive element coupled to a node between the first and second inductive elements and ground potential;
wherein the first and second inductive elements comprise first and second sets of wirebonds coupled in parallel, respectively.

22. The RF power amplifier of claim 21, wherein a resistance of the resistive element is based on an equivalent resistance of the input of the transistor.

23. The RF power amplifier of claim 22, wherein a ratio of the resistance of the resistive element and the equivalent resistance of the input of the transistor is approximately 0.25 to 2.

24. The RF power amplifier of claim 21, wherein the output impedance matching network comprises:
a first series inductive element coupled to the output of the transistor;
a second series inductive element coupled in series with the first inductive element and the output transmission line;
a third inductive element; and
a capacitive element coupled in series with the third inductive element between the output of the transistor and ground potential.

25. The RF power amplifier of claim 1, wherein the second input impedance matching network further comprises a plurality of wirebonds electrically coupling the resistive element to the input of the transistor.

26. The RF power amplifier of claim 15, wherein the second input impedance matching network further comprises a plurality of wirebonds electrically coupling the resistive element to the input of the transistor.

* * * * *